(12) United States Patent
Bickel

(10) Patent No.: US 10,718,813 B2
(45) Date of Patent: Jul. 21, 2020

(54) MONITORING METHOD FOR INDUCTION MOTOR

(75) Inventor: Jon A. Bickel, Murfreesboro, TN (US)

(73) Assignee: SCHNEIDER ELECTRIC USA, INC., Boston, MA (US)

( * ) Notice: Subject to any disclaimer, the term of this patent is extended or adjusted under 35 U.S.C. 154(b) by 668 days.

(21) Appl. No.: 14/405,702

(22) PCT Filed: Jun. 8, 2012

(86) PCT No.: PCT/US2012/041711
§ 371 (c)(1),
(2), (4) Date: Dec. 4, 2014

(87) PCT Pub. No.: WO2013/184143
PCT Pub. Date: Dec. 12, 2013

(65) Prior Publication Data
US 2015/0168495 A1     Jun. 18, 2015

(51) Int. Cl.
*G01R 31/34*          (2020.01)
(52) U.S. Cl.
CPC ........... *G01R 31/34* (2013.01); *G01R 31/343* (2013.01)
(58) Field of Classification Search
CPC .............................. G01R 31/34; G01R 31/343
USPC .......................................................... 702/60
See application file for complete search history.

(56) References Cited

U.S. PATENT DOCUMENTS

| | | |
|---|---|---|
| 4,636,702 A | 1/1987 | Hedges |
| 5,030,917 A | 7/1991 | Kliman |
| 5,521,482 A * | 5/1996 | Lang ..................... G01R 31/343 318/800 |
| 2006/0082336 A1* | 4/2006 | Kurosawa ................. H02P 1/46 318/400.12 |
| 2008/0048624 A1* | 2/2008 | Davison ................... H02H 1/06 320/166 |
| 2009/0284211 A1* | 11/2009 | Gao ..................... G01R 31/343 318/727 |
| 2010/0060289 A1 | 3/2010 | Wiedenbrug et al. |

(Continued)

FOREIGN PATENT DOCUMENTS

WO     2006000488 A1     1/2006

OTHER PUBLICATIONS

International Search Report from corresponding PCT/US2012/041711 dated Mar. 3, 2014.

*Primary Examiner* — Yoshihisa Ishizuka
(74) *Attorney, Agent, or Firm* — Lando & Anastasi, LLP

(57) ABSTRACT

A method of automatically identifying an anomalous condition of an induction motor by normalizing the voltage measured across its terminals relative to the power flow to the motor or the motor's impedance. The starting and/or run current and associated voltage of the motor is measured, and a voltage variation between the measured voltage and the motor's rated voltage is determined. The power flow or impedance at the voltage variation is calculated to determine an expected power flow or impedance at the measured voltage variation. The actual power flow or impedance is compared against a nominal or expected power flow or impedance or a statistical comparison is carried out on a historical set of power flow or impedance values within an expected range at the voltage variation. When the measured values deviate from the expected ones, an alarm is triggered to indicate a potential anomaly with the motor or external thereto.

22 Claims, 4 Drawing Sheets

(56) References Cited

U.S. PATENT DOCUMENTS

| | | | | |
|---|---|---|---|---|
| 2010/0148708 A1* | 6/2010 | Jorgenson | ............... | G11B 19/02 |
| | | | | 318/400.3 |
| 2010/0194324 A1* | 8/2010 | Kasztenny | ............. | G01R 31/34 |
| | | | | 318/490 |
| 2010/0295491 A1* | 11/2010 | Schulz | ................. | G01R 31/346 |
| | | | | 318/490 |

* cited by examiner

MONITORING METHOD FOR INDUCTION MOTOR

FIELD OF THE INVENTION

The present disclosure relates generally to systems and methods for automatically identifying anomalies or problems with electrical apparatuses, such as induction motors.

BACKGROUND

For certain applications, motors are an essential piece of electrical equipment, in large, industrial facilities and residential buildings alike. They are used in a wide range of applications—from the large three-phase induction motors that the drive reactor coolant pumps in nuclear generation stations, to the small universal motors that drive a vacuum cleaner. Motors are a crucial component of every nation's economy not only because of the work they perform, but also because of the considerable amount of energy they consume.

The most commonly used type of motor is a polyphase induction motor with over 90% of those being squirrel-cage induction motors. Polyphase induction motors are popular for several reasons including: they are relatively inexpensive; they enjoy a rudimentary design; they are readily replaced; they have reliable operation; and they have a range of mounting styles and environmental enclosures.

Due to the significant capital and operational investments made by enterprises in motors—investments that impact the bottom line—knowing the state of their condition is vital. Induction motors are generally robust, but they can fail prematurely. Causes of motor failures include poor maintenance practices, improper lubrication, harsh operating environment, inadequate source voltage, or misapplication of the motor. All of these issues have one commonality: excessive temperature rise. Excessive heat is the nemesis of motors; temperature rise can originate in the bearings (lubrication, alignment, etc.), in the windings (design, voltage, etc.), or can be imposed by external conditions (ambient temperature, atmosphere, etc.).

One way of monitoring the health of a motor is to monitor the current used by the motor. These monitoring techniques do not account for variations in the voltage that can affect the inrush current and the full-load current (FLA). The inrush (or locked-rotor) current is the current drawn by the motor when it is initially started up from a stopped position. The actual inrush current value is typically much higher than the rated full-load current, and is usually stated by the manufacturer of the motor on the nameplate as the locked-rotor current. Many operators correctly assume that as a motor's terminal voltage decreases below its rated voltage, the motor's inrush and full-load currents will increase. However more counter-intuitively, if the motor's terminal voltage increases above its rated voltage, the motor's inrush and full-load currents will also increase. Misunderstanding the relationships between voltages and currents can result in misdiagnosed motor conditions or assumptions that an induction motor is operating within normal range.

Known motor monitoring schemes do not account for the relationships of high and low voltage motor terminal variations with the motor's startup and run currents. They either assume that whatever variation in the voltage that exists contributes a negligible effect on the motor's performance or assume that the actual voltage across the motor's power terminals is constant relative to the rated voltage. In real world induction motors, its terminal voltage varies and can have a significant impact on motor performance that can indicate a potential mechanical problem with the motor. More importantly, not accounting for variations at the motor's terminals can provide misleading conclusions regarding the motor's health.

SUMMARY

The idea disclosed in this document describes a new method to evaluate data captured by IEDs to analyze, identify, and report potential motor issues. Aspects described herein apply to asset management, which refers to helping the customer understand the condition of the equipment within their facility. Providing the customer with an early indication of a problem allows them to more efficiently and cost effectively address the problem.

Aspects of the present disclosure can help customers recognize problems with their motors, which are a major capital investment and a key operational component for many industrial and commercial customers. The systems, algorithms, and methods described herein provide motor diagnostics that are heretofore unavailable.

According to an aspect of the present disclosure, a method of automatically determining an anomalous condition of an induction motor is provided. The method includes the steps of: receiving, by an intelligent electronic device, a measured inrush or starting current flowing into an induction motor during a startup period of the induction motor; receiving, by the intelligent electronic device, a voltage measured across power terminals of the induction motor during the startup period; determining, using a controller, a voltage variation by comparing the voltage measured across the power terminals with a rated voltage of the induction motor; calculating, using the controller or another controller, a characteristic function that includes the voltage measured across the power terminals and the inrush or starting current; comparing, using the controller or another controller, the characteristic function with a baseline using the voltage variation to determine whether a criterion is satisfied; and responsive to the criterion being satisfied, providing, using the controller or another controller, an indication of an anomalous operation of the induction motor.

The baseline can be a theoretical function that includes a rated inrush or locked-rotor current and the rated voltage. The comparing can include determining whether the characteristic function deviates from the theoretical function at the same voltage variation. The theoretical function can be a theoretical impedance of the induction motor operating under rated conditions. The theoretical impedance can be calculated using a rated inrush or locked-rotor current and the rated voltage. The characteristic function can be an impedance of the induction motor calculated using the measured current and the voltage measured across the power terminals.

The theoretical function can be a theoretical power flow to the induction motor operating under rated conditions. The theoretical power flow can be calculated using a rated inrush current or locked-rotor current and the rated voltage. The characteristic function can be a power flow to the induction motor using the measured current and the voltage measured across the power terminals. The power flow to the induction motor can be real power, reactive power, or apparent power.

The baseline can be a theoretical function that includes a rated inrush or locked-rotor current and the rated voltage. The comparing can include a statistical comparison of the characteristic function and historical characteristic functions including historical values of voltage measured across the power terminals and inrush or starting current supplied to the induction motor.

The measured inrush or starting current and the voltage measured across the power terminals can be received responsive to the measured inrush or starting current being applied to the induction motor for energizing the induction motor transitioning the induction motor from a stopped to a starting operating condition. The characteristic function can be an impedance of the induction motor. The baseline can be a theoretical impedance of the induction motor operating under rated conditions. The theoretical impedance can be calculated using a rated inrush or locked-rotor current and the rated voltage.

The comparing can include determining whether the impedance at the voltage variation deviates from the theoretical impedance at the same voltage variation by more than a threshold, and if so, determining that the criterion is satisfied, wherein the threshold is a fixed threshold, a relative threshold, or a statistical threshold.

The comparing can include a statistical comparison of the impedance at the voltage variation and a historical impedance value that includes a historical value of a voltage measured across the power terminals and an inrush or starting current supplied to the induction motor prior to the receiving the current. The characteristic function can be a power flow to the induction motor. The baseline can be a theoretical power flow to the induction motor operating under rated conditions. The theoretical power flow can be calculated using a rated inrush or locked-rotor current and the rated voltage. The power flow can be calculated using the measured current and the voltage measured across the power terminals.

The comparing can include determining whether the power flow at the voltage variation deviates from the theoretical power flow at the same voltage variation by more than a threshold, and if so, determining that the criterion is satisfied. The threshold can be a fixed threshold, a relative threshold, or a statistical threshold.

The comparing can include a statistical comparison of the power flow at the voltage variation and a historical power flow value at the same voltage variation, the historical power flow value including a historical value of a voltage measured across the power terminals and an inrush or starting current supplied to the induction motor prior to the receiving the current.

The indication of the anomaly can include an alarm indicating the amount by which the voltage measured across the power terminals or the measured current deviates from the rated voltage or a rated locked-rotor current of the induction motor. The indication of the anomaly can include whether an impedance of the induction motor at the voltage variation during the startup period is above or below an expected impedance of the induction motor at the voltage variation. The impedance can be calculated using the measured current and the voltage measured across the power terminals. The expected impedance at the voltage variation can be calculated or derived based on a rated inrush or locked-rotor current of the induction motor and the rated voltage including the voltage variation.

In response to the impedance exceeding the expected impedance, the anomaly can indicate potential damage to a rotor or a rotor bar of the induction motor, a potential poor connection relative to one or both power terminals of the induction motor or to a stator winding of the induction motor. In response to the impedance being below the expected impedance, the anomaly can indicate a potential short-circuit in a winding of a coil around a pole of the induction motor or between adjacent coils of the induction motor or a potential insulation breakdown in the induction motor.

The method can further include: receiving, by the intelligent electronic device, a measured steady-state current flowing into the induction motor during a steady-state operation of the induction motor; receiving, by the intelligent electronic device, a second steady-state voltage measured across the power terminals during the steady-state operation; determining, using the controller or another controller, a steady-state voltage variation by comparing the measured steady-state voltage with the rated voltage; calculating, using the controller or another controller, a second characteristic function that includes the measured steady-state voltage and the measured steady-state current; comparing, using the controller or another controller, the second characteristic function with a second baseline using the steady-state voltage variation to determine whether a steady-state criterion is satisfied; and responsive to the steady-state criterion being satisfied, providing, using the controller or another controller, the indication of the anomaly.

According to another aspect of the present disclosure, a non-transitory computer-readable medium encoded with instructions to cause one or more controllers to implement a method is provided. The method includes: receiving a measured inrush or starting current flowing into an induction motor during a startup period of the induction motor; receiving a voltage measured across power terminals of the induction motor during the startup period; determining a voltage variation by comparing the voltage measured across the power terminals with a rated voltage of the induction motor; calculating a characteristic function that includes the voltage measured across the power terminals and the inrush or starting current; comparing the characteristic function with a baseline using the voltage variation to determine whether a criterion is satisfied; and responsive to the criterion being satisfied, providing an indication of an anomaly of the induction motor.

According to yet another aspect of the present disclosure, a method of automatically determining an anomalous condition of an induction motor is provided. The method includes: receiving, by an intelligent electronic device, an inrush or starting current flowing into and a voltage measured across power terminals of an induction motor at an initial startup period of the induction motor; comparing, by the intelligent electronic device, the received voltage with a rated voltage of the induction motor to produce a voltage variation; calculating, using a controller, a characteristic function that includes the received voltage and the inrush or starting current; comparing, using the controller or another controller, the characteristic function with a baseline using the voltage variation to determine whether a first criterion is satisfied; receiving, by the intelligent electronic device, a steady-state current flowing into and a second voltage measured across the power terminals during a steady-state operation of the induction motor; comparing, using the controller or another controller, the second received voltage with the rated voltage to produce a second voltage variation; calculating, using the controller or another controller, a second characteristic function that includes the second received voltage and the steady-state current; comparing, using the controller or another controller, the second characteristic function with a second baseline using the second voltage variation to determine whether a second criterion is satisfied; and responsive to the first criterion or the second criterion being satisfied, providing, using the controller or another controller, an indication of an anomalous condition of the induction motor.

The foregoing and additional aspects of the present disclosure will be apparent to those of ordinary skill in the art in view of the detailed description of various aspects, which are made with reference to the drawings, a brief description of which is provided next.

BRIEF DESCRIPTION OF THE DRAWINGS

The foregoing and other advantages of the present disclosure will become apparent upon reading the following detailed description and upon reference to the drawings.

DETAILED DESCRIPTION

Figure 1:
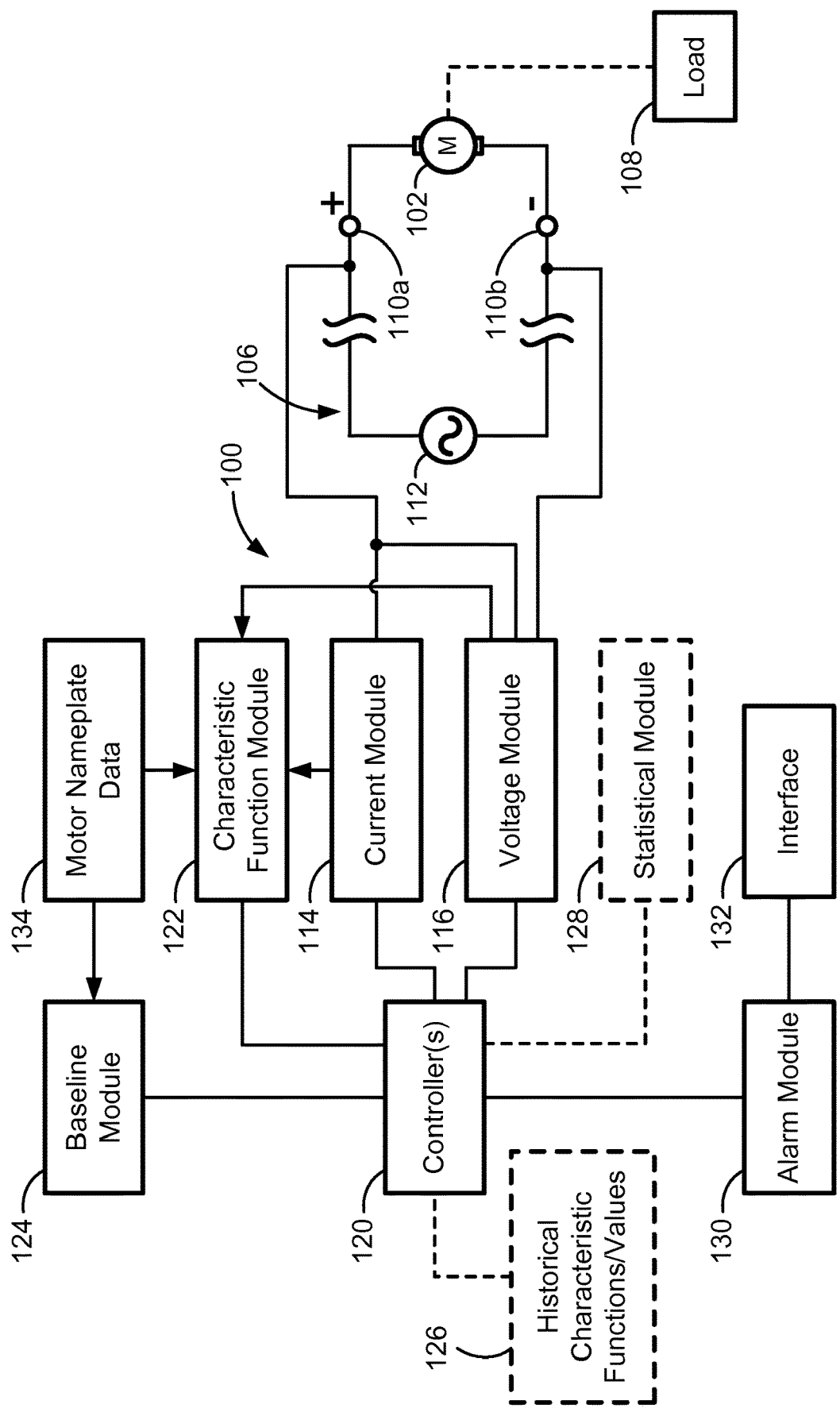
FIG. 1 is a functional block diagram of devices and modules that can be used to carry out an implementation of aspects of the present disclosure.

Referring to FIG. 1, an intelligent electronic device (IED) 100, such as a permanently-installed power monitoring device, can provide a great deal of information about an induction motor 102. By monitoring the voltage, current, and temperature, the IED 100 can provide data on many aspects of an induction motor including the quality of the motor's terminal voltage, energy usage by the motor, motor loading concerns, excessive motor cycling, environmental concerns, and a motor's starting characteristics. When an induction motor 102 is initially energized by an electrical circuit 106 (during the startup period), a large amount of current flows into the motor's stator windings because the motor's stationary rotor appears to be the equivalent of a short circuit. This initial or startup flow of current (sometimes referred to as an inrush current or a locked-rotor current) may be up to 10 times the motor's rated full-load current (FLA). This startup flow of current will be referred to herein as a starting current, in contradistinction from a run current, which is the current used by the motor 102 under steady-state or normal operating load conditions. The initial magnitude of the inrush current is dependent on the electrical characteristics of the motor 102; not the mechanical characteristics of the motor 102 or its attached load 108. As the motor's stator is magnetized, the electrical energy is converted into kinetic energy and the rotor begins to rotate. The interaction between the magnetic flux and the current conductors in the rotor produces a torque that corresponds to the rotation of the magnetic field. The other components and modules of FIG. 1 will be identified next and discussed in more detail below.

The IED 100 includes a current module 114 and a voltage module 116. The current module 114 includes a sensor for measuring a current flowing into the induction motor 102. The voltage module 116 includes a sensor for measuring a voltage across the power terminals 110*a,b* of the induction motor 102 (although only one set of power terminals are shown, for three-phase motors, as is already known, three sets of power terminals are present). The IED 100 includes a controller, such as one of the one or more controllers 120 shown in FIG. 1. In implementations involving multiple controllers 120, the controllers 120 can be distributed across a network. The particular architecture is not salient to implementing the aspects of the present disclosure. For example, the IED 100 can include one of the controllers 120, and one or more other controllers 120 can be distributed over a network among one or more other computing devices, such as servers, computers, or other processing units. The one or more controllers 120 are coupled to a characteristic function module 122 and a baseline module 124.

It should be noted that the algorithms, block diagrams, or methods illustrated and discussed herein as having various modules or blocks or components that perform particular functions and interact with one another. It should be understood that these modules are merely segregated based on their function for the sake of description and can represent computer hardware and/or executable software code that is stored on one or more non-transitory computer-readable medium/media for execution by one or more controllers 120 on appropriate computing hardware. The various functions of the different modules, blocks, or components can be combined or segregated as hardware and/or software stored on one or more non-transitory computer-readable medium or media in any manner, and can be used separately or in combination with one another.

The characteristic function module 122 and the baseline module 124 receive motor nameplate data 134 that includes nameplate rating information relating to the induction motor 102. Nameplate rating information includes a rated full load current (FLA), a rated locked-rotor current (LRA), a rated or nominal voltage (such as 460V), a rated power factor (PF), among other conventional nameplate rating information. An optional database of historical characteristic functions or values 126 can be coupled to the one or more controllers 120. The one or more controllers 120 can be coupled to an optional statistical module 128 and to an alarm module 130. The alarm module 130 is coupled to an interface 132 for communicating information from the alarm module 130 to an external system that can include a display device, for example, for displaying information from the alarm module 130.

The impedance of the induction motor 102 during startup can be calculated using the following equations:

$$Z_m = \left(\frac{I_{FLC}}{I_{LRC}}\right)\left(\frac{V_m^2 \cos\phi_m}{P_m}\right) \quad \text{(Eqn. 1)}$$

$$R_m = \frac{(P_m)(I_{LRC})\cos\phi_s}{3(I_{FLC})(I_{LRC}^2)\cos\phi_m} \quad \text{(Eqn. 2)}$$

$$X_m = \sqrt{Z_m^2 - R_m^2} \quad \text{(Eqn. 3)}$$

Where,
$Z_m$ is the total startup impedance of the motor in Ohms,
$R_m$ is the startup resistance of the motor in Ohms,
$X_m$ is the startup reactance of the motor in Ohms,
$I_{LRC}$ is the locked-rotor current in Amperes, $I_{FLC}$ is the rated full-load current of the motor at full load in Amperes, $V_m$ is the rated voltage of the motor in volts, $P_m$ is the rated power of the motor in Watts, Cos $\phi_m$ is the motor's power factor at full load, and Cos $\phi_s$ is the motor's power factor at startup (e.g., under locked-rotor conditions).

A motor is stressed mechanically, electrically, and thermally during startup. Over time, these stresses can result in changes in the motor's electrical characteristics, and subsequently its impedance. Equation 1 shown above for $Z_m$ provides the theoretical total startup impedance for an induction motor; however, it does not provide any indication of changes in the motor's electrical characteristics. The purpose of this feature is to ascertain a motor's condition during startup using empirical data from a measurement device. These changes can be reviewed to identify potential degradation of the motor.

Aspects of the present disclosure determine the relationship between a motor's expected performance against its actual performance to identify potential motor issues. Furthermore, aspects of the present disclosure evaluate a motor's start and run parameters over successive operational cycles to provide an indication of motor anomalies. While Equations 1-3 listed above provide theoretical impedance values for an induction motor under ideal (rated) conditions, any variance of the actual applied voltage at the motor's terminals 110a,b will impact the starting and running values.

When a low voltage (i.e., below its rated voltage) is applied to a motor's terminals 110a,b, the current drawn by the motor 102 increases accordingly to provide the same electrical power to the load connected to the motor 102. If the applied current exceeds the motor's full-load current (FLA) rating, the motor's temperature can increase beyond the motor's recommended rating and may damage or reduce the motor's operating life.

Similarly, applying a high voltage (i.e., above its rated voltage) across the motor's terminals 110a,b can also increase the motor's current due to the effects of saturation. The saturation curve for a motor is related to the amount of iron in the stator (i.e., the motor's design). Once the motor's terminal voltage reaches a certain magnitude, the motor's current will increase because the inductive reactance of the motor decreases. Not only does the motor's efficiency decrease, but its temperature increases and may damage or reduce the motor's operating life. High voltage conditions can also adversely impact other types of equipment including transformers and lighting components (ballasts, bulbs, etc.).

Figure 2:
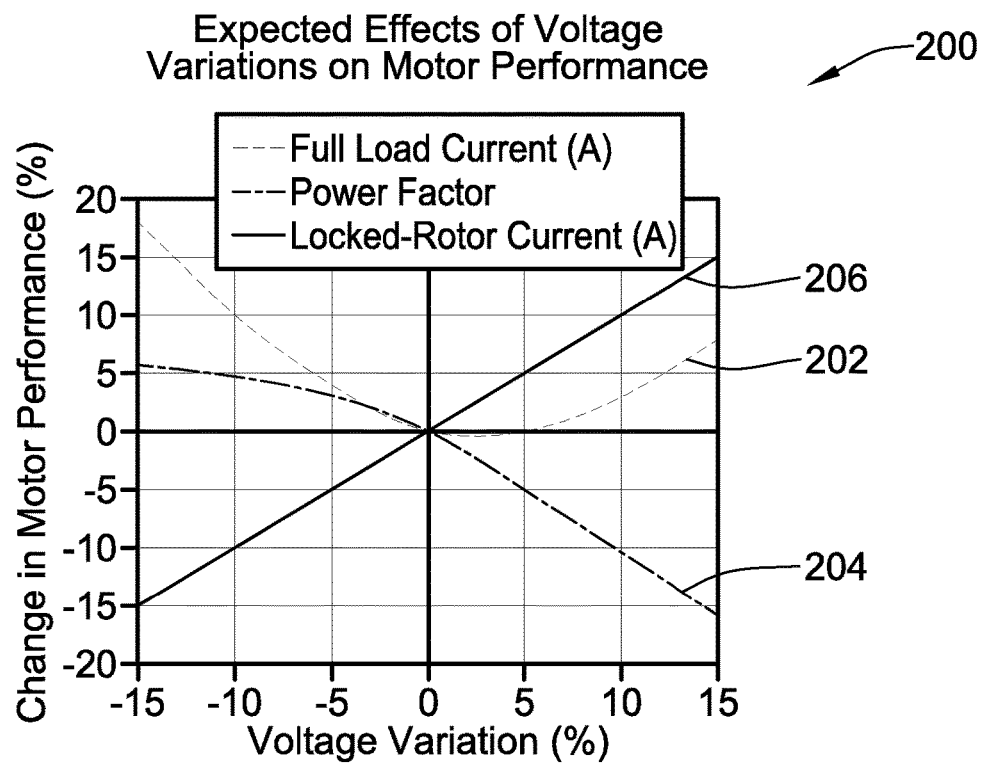
FIG. 2 shows three plots depicting how variations in the voltage of a motor from its rated voltage are expected to affect the performance of the motor as a function of the locked-rotor current (LRA), the full-load current (FLA), and the power factor (PF) of the motor.

FIG. 2 is a plot 200 illustrating the effects of terminal voltage variations on the starting (measured inrush) current (LRA) 206, full-load current (FLA) (or run current) 202, and power factor (PF) 204 of the induction motor 102, plotted against a percentage change in motor performance. This becomes even more important in practical applications because a motor's rated voltage can (and often does) vary from the electrical system's nominal voltage. For example, a standard voltage rating for a NEMA (National Electrical Manufacturers Association) induction motor is 460 volts; however, these motors are generally connected to 480-volt nominally rated electrical systems 112. Assuming 480 volts (such as from a polyphase ac source 112) are applied to a 460-volt motor's terminals 110a,b, there can be a voltage variation of approximately +4.35%. Based on the relationships described in FIG. 2, a voltage increase from 0% to 5% at the motor's terminals 110a,b will result in a 5% increase of the motor's 102 starting or inrush current (see curve 206), almost no change to its full-load current (FLA) (see curve 202), and a 5% reduction in its power factor (PF) (see curve 204). Several other operational parameters of the motor 102 are affected as well including its starting and maximum torque, efficiency, and even its run temperature. The rated voltage and rated locked-rotor current (LRA) can be specified in motor nameplate data 134 stored in a memory device.

Equations 4-5 listed below provide a general relationship between the induction motor's 102 terminal voltage 110a,b and its full-load current (FLA), power factor (PF), and starting locked-rotor current (LRA).

$$FLA=(-0.00004696969)x^4+(0.0001944444)x^3+ \\ (0.0674810606)x^2-(0.38427777)x+ \\ 0.1948051948 \quad \text{(Eqn. 4)}$$

$$PF=(0.0000439393939)x^4+(0.00027777)x^3- \\ (0.0329545455)x^2-(0.7905753968)x- \\ 0.1163419913 \quad \text{(Eqn. 5)}$$

$$\text{Percent change in Starting Amperage}=x \quad \text{(Eqn. 6)}$$

Where,

FLA is the full-load current as a percent of the motor's nominal (rated) value,

PF is the power factor as a percent of the motor's nominal (rated) value, and x is the voltage variation of the motor's actual terminal voltage as a percent of the motor's nominal (rated) voltage value.

Equations 4-6 are used to plot the data for the curves in FIG. 2, and are bounded by a ±15% voltage variation at the motor's power terminals.

Typical evaluations, trends and comparisons of motor-starting characteristics (under inrush current conditions) are based on measured starting (e.g., measured inrush) currents, and do not consider the effects of a motor's terminal voltage on those current values. Normalizing a motor's inrush current with respect to the relationship of the measured terminal voltage (as measured across the terminals 110a,b) and nameplate rated voltage (such as stored as the motor nameplate data 134) can identify potential issues within motor 102. Aspects of the present disclosure provide at least two ways of evaluating motor issues: 1) using motor power flows (real, reactive, or apparent) at motor startup (e.g., under starting current or inrush conditions), and 2) motor input impedance (e.g., at the terminals 110a,b) at startup. Each of these implementations accounts for the voltage magnitude's influence (and how the voltage varies relative to the rated voltage) on motors during their most stressful operating period, namely at startup or under locked-rotor conditions.

Figure 3:
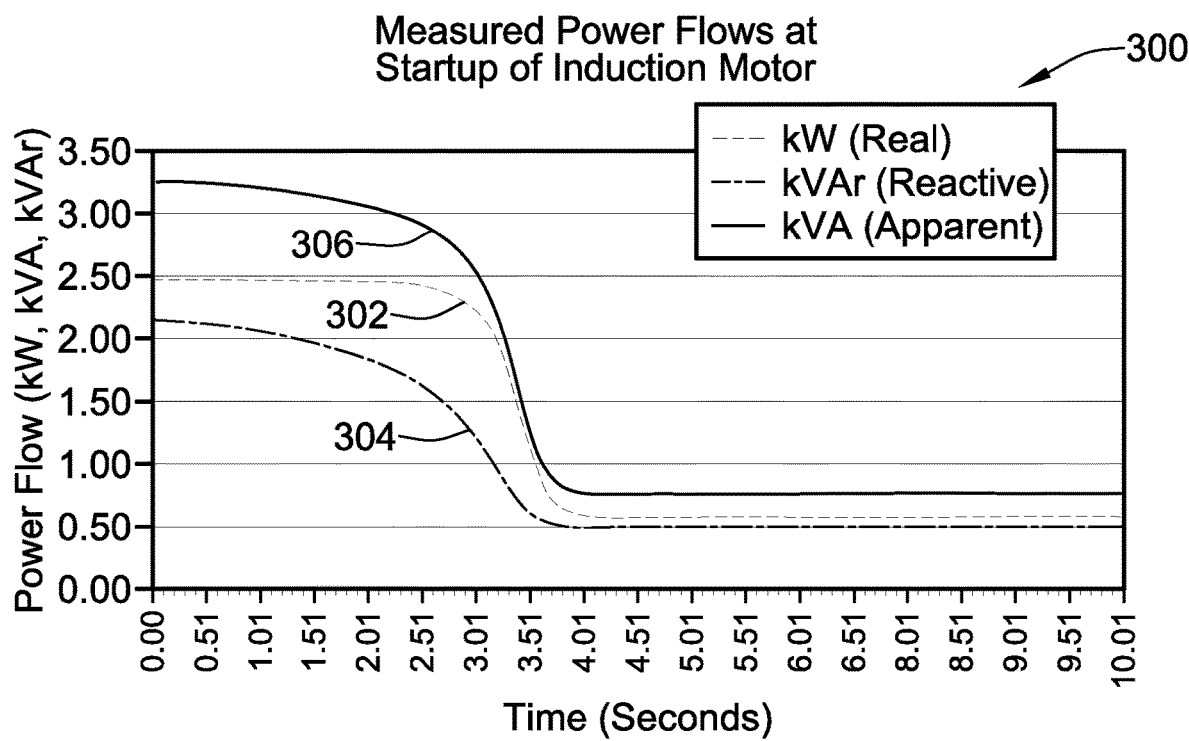
FIG. 3 are plots of real, reactive, and apparent power flows as measured during the motor startup period as a function of time.
Figure 4:
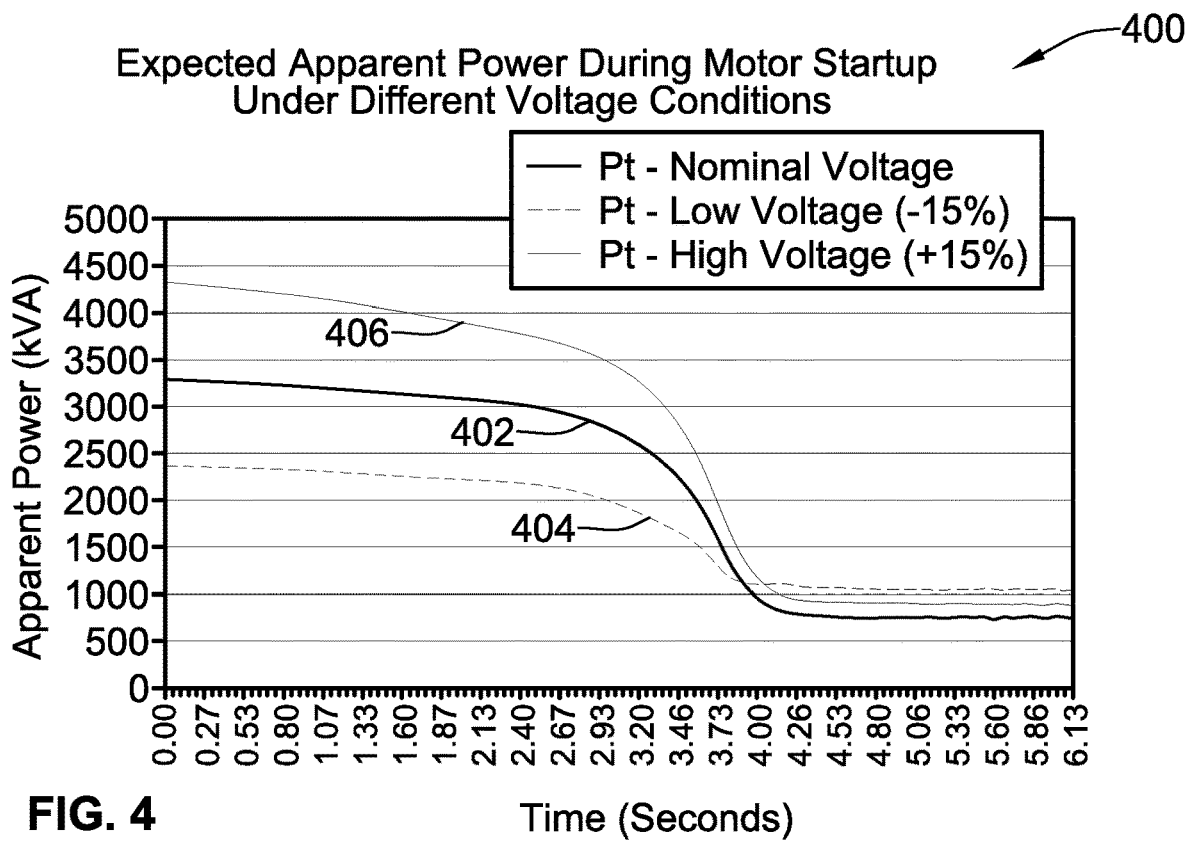
FIG. 4 are plots of the apparent power flow that is expected to the motor during the startup period for three different voltage variations.

Evaluating power flows during the startup period of the induction motor 102 requires both voltage and current measurements. FIG. 3 is a plot 300 illustrating the changes in three types of power flows, namely, the real power (kW) 302, reactive power (kVAr) 304, and the apparent power (kVA) 306, during and following the startup period (expressed as time in seconds) of a small induction motor as measured by the IED 100. Using Equations 4 and 6 above, the expected initial power transient (when the motor is first started) and the steady-state power flow (when the motor is operating under full load conditions) can be approximated during a motor startup period. For example, FIG. 4 is a plot 400 of the expected apparent power values of the motor 102 starting under three different voltage conditions versus time in seconds: low voltage (−15% of the nominal or rated voltage) 404, nominal (rated) voltage 402, and high voltage (+15% of the nominal or rated voltage) 406. It is readily apparent that ignoring the influence of a motor's terminal voltage during the startup period directly affects the magnitude of the power (and current flows). Consequently, it is difficult to recognize whether the current changes between sequential motor starts are the result of motor problems or may be attributed to voltage variations.

It should be noted that the initial inrush current at the motor 102 is deterministic (Equation 6) based on voltage magnitudes and the impedances at the motor 102, assuming the motor 102 is operating within rated parameters. The full load current (FLA) is also deterministic (Equation 4), assuming the motor 102 is loaded at its nameplate rated load and operating within rated parameters. Low-voltage starting conditions will reduce a motor's starting torque, pull-up torque, and pullout torque, which could result in the motor's stalling.

Evaluating measured motor's power flows against theoretical or expected power flows can indicate potential internal problems or anomalies with a motor because the power flows are deterministic. Trending the power flow profiles can also indicate other problems with a motor including near-stall conditions, long starting times, and even the need to incorporate reduced voltage starting techniques.

A second aspect of the present disclosure evaluates the impedance downstream (relative to the electrical circuit 106) for the IED 100. Just as the motor's initial power flow during the startup period is deterministic based on voltage levels across the motor's terminals 110a,b, current levels provided to the motor 102, and the motor's impedance characteristics, so too is the motor's impedance. As shown in Equations 1, 2, and 3 above, a motor's rated resistance, reactance, and impedance at startup can be calculated. Each of the components in these equations is either estimable from measured data or provided on the motor's nameplate (and extracted from, for example, the motor nameplate data 134). The motor's resistance at startup is fixed; however, the reactance (and thus, impedance) is a function of frequency (including harmonic distortion). All are subject to Ohm's Law, so a motor's initial impedance values can be determined based on voltage and current values at startup (under locked-rotor conditions). Changes in an induction motor's predicted impedance based on actual measured values can indicate fundamental changes in the motor's design characteristics, which in turn indicate a potential problem or anomaly with the motor.

Figure 5:
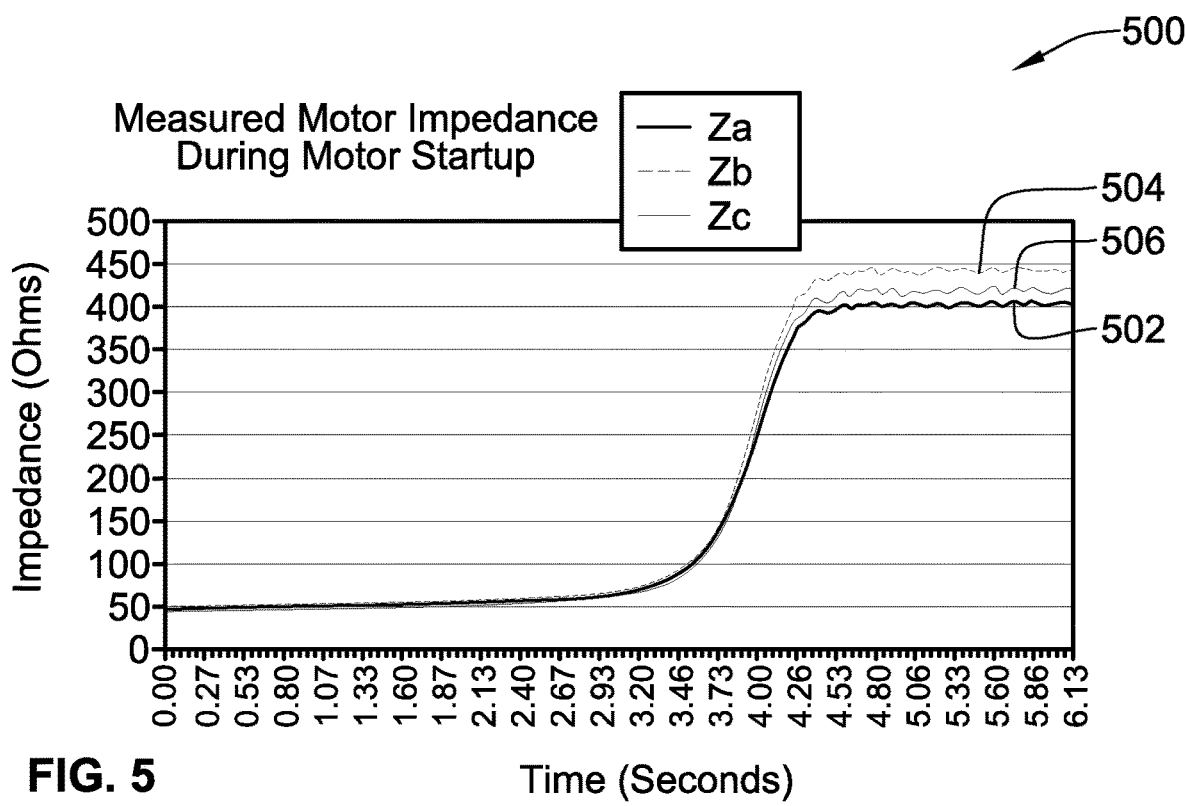
FIG. 5 are plots of the motor's three-phase impedances as measured during the startup period.

Similar to motor start power flow analysis described above, changes in impedance can be trended and analyzed accordingly. Once the expected startup impedance is determined through theoretical, derived and/or empirical data, statistical analysis of the data (or some other method) can be performed. For example, deviations of the impedance values exceeding some number of standard deviations, exceeding a fixed threshold, or exceeding a percentage of the average measurement (or minimum measurement) can initiate an alarm. FIG. 5 is a plot 500 of measured changes in a motor's impedance versus time (in seconds) using samples of measured voltage and current captured by the IED 102 during the motor's startup period through its steady-state (full-load conditions). The Za, Zb, and Zc components of the impedance of the motor 102 are represented by the curves 502, 504, 506, respectively, versus time.

The majority of induction motor electrical problems occur at startup due to the inherent stresses during that period. Of these problems, the majority exhibit low impedance characteristics. A decrease in the impedance can indicate shorted turns or windings, insulation damage or failure. For example, Y-connected motor windings exhibiting a shorted turn(s) will experience low-inductance measurements on two of the three phases. Likewise, Δ-connected windings exhibiting a shorted turn(s) will experience low inductance on only one of the three phases.

Some motors will exhibit high impedance characteristics due to various types of high-resistance connections, broken or cracked rotor bars, or some other source that resists the flow of current. Some causes of high-resistance connections include: corroded terminals, loose bus bars, corroded or damaged contacts, corroded fuse clips, open leads, loose cables, etc. An increase in impedance may indicate high-resistance connections, broken or cracked rotor bars, or another source that resists the flow of current. Any of these foregoing problems can be detected and indicated by the alarm module 130 and communicated via the interface 132 to an external system for display or further processing.

Aspects of the present disclosure can be deployed on a phase by phase basis or on an average of all three phases. Three-phase systems are not perfectly balanced, so each motor phase can experience different power flows and impedances at startup and run conditions. Each discrete phase can be tracked and trended accordingly.

Figure 6:
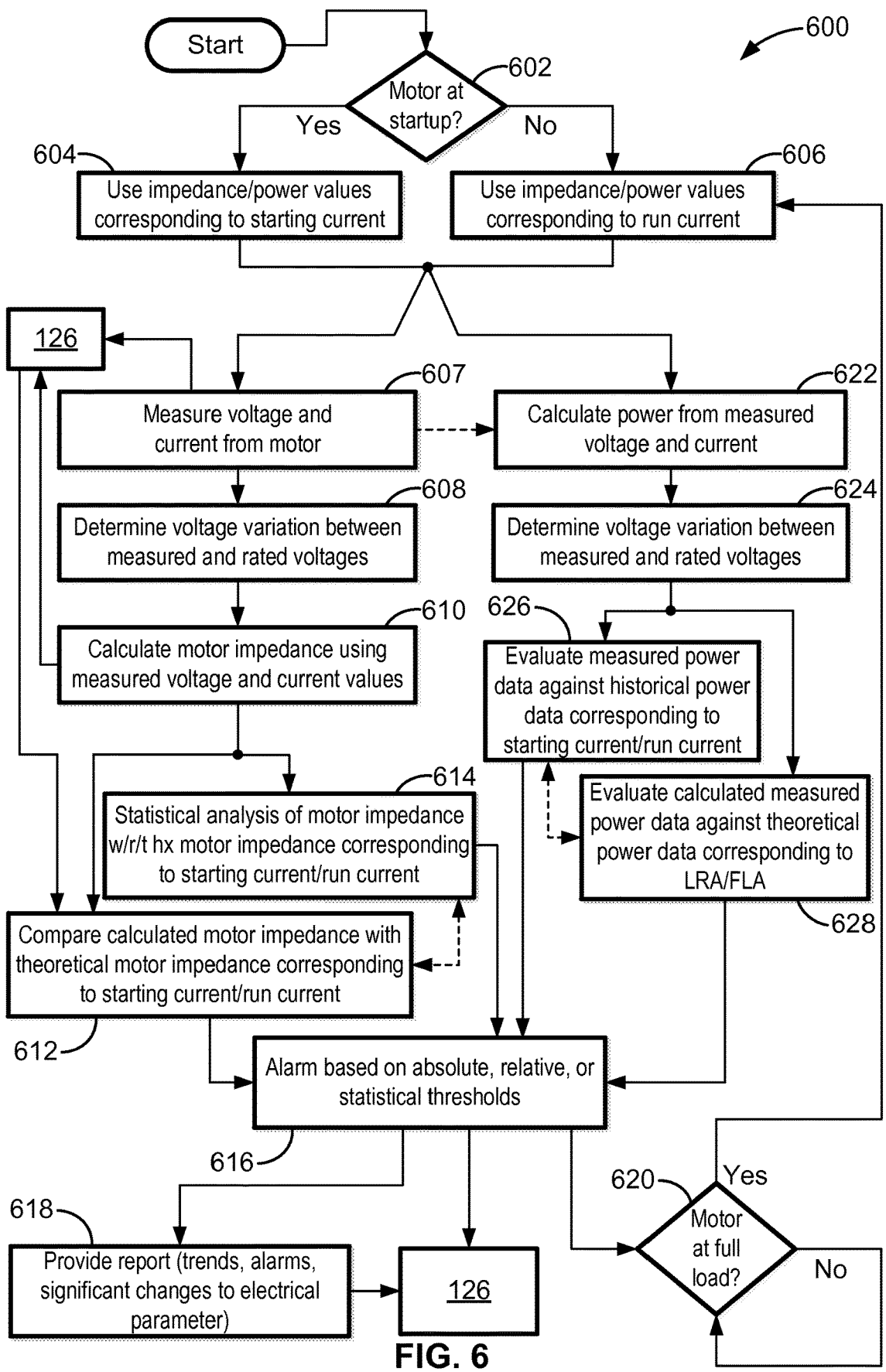
FIG. 6 is a flowchart of an example algorithm for implementing aspects of the present disclosure.

FIG. 6 is a flow diagram or algorithm 600 showing steps to automatically, under control of the one or more controllers 120, evaluate the condition of an induction motor 102. A method of automatically determining an anomalous condition of an induction motor, such as the induction motor 102, is disclosed herein. An example of an anomalous condition is a condition that causes the induction motor 102 to operate outside of its rated parameters or a condition that if continues unabated will cause the motor 102 to operate outside of its rated parameters or lead to damage or failure. Specific examples of anomalous conditions include a damaged rotor bar, a turn-to-turn short circuit. The machine-readable instructions corresponding to the steps of the algorithm 600 can be carried out by the one or more controllers 120 in conjunction with any combination of one or more of the modules 114, 116, 122, 124, 128, 130 shown in FIG. 1.

The algorithm 600 determines whether an operational condition of the motor 102 is in a startup period (602). The startup period includes a starting condition of the motor 102 immediately after a rated voltage is applied to its terminals 110a,b. During this startup period, the measured current corresponds to a measured inrush or starting current. Although the term locked-rotor current (LRA) is a fixed value given for a specific manufacturer's motor model, the term inrush current refers to a measured value of starting current during startup of a motor, and the term locked-rotor current refers to a theoretical or rated value of current during the startup of the motor, as specified on the nameplate by the manufacturer of the motor. The startup period is followed by a steady-state period during which the motor 102 draws a run or steady-state current. For convenience, these periods can be referred to herein as the starting period (when an inrush or starting current is drawn by the motor 102 at startup) or the running period (when the steady-state current is drawn by the motor 102 as it is driving the load 108 or during normal operation when the motor 102 reaches its steady-state speed). Measured values and calculated values can be stored in the database 126 for the starting period and separately for the running period. To emphasize, there are two periods of measurement and analysis. The first period is at startup when the motor 102 is energized and begins to rotate, during which it draws an inrush or starting current. This current can be up to 10 times higher than the normal current it draws during steady-state operation, and is estimated by the locked-rotor current (LRA) on the motor's nameplate. The second period is when the motor is operating under steady-state conditions and is using nominal current. The algorithm 600 can be used to detect an anomaly in the motor 102 during either or both of these periods. It is not necessary to analyze the current and voltage during both starting and running periods, either will suffice. However, it is contemplated as well that the voltage and current of the motor can be analyzed during both periods.

If the motor is in a startup period (602), the algorithm 600 uses the impedance or power values corresponding to the measured starting current (604). Otherwise, the algorithm 600 uses the impedance of power values corresponding to the measured run current (606). For example, when a measured value is compared against a baseline by the baseline module 124, as explained below, the baseline includes values or calculations determined during the starting or running periods of motor operation or using theoretical or rated values under LRA or FLA conditions. Power and impedance are examples of a characteristic of electricity. A function can correspond to a mathematical equation that is implemented by the algorithm 600. An example of a characteristic function includes a mathematical equation that uses a characteristic (such as impedance or power) to determine an unknown quantity. These mathematical equations are solved by the characteristic function module 122, using inputs from the current module 114, the voltage module 116, and the motor nameplate data 134.

After determining whether to use starting current/LRA or run current/FLA functions or values, the algorithm 600 uses the current module 114 and the voltage module 116 to measure the voltage across the terminals 110a,b of the motor 102 and the current drawn by the motor during the starting or run current period, whichever is applicable (606). In the case of starting current, the current module 114 of the intelligent electronic device (IED) 100 receives a measured inrush current flowing into the induction motor 102 during a startup period of the induction motor 102 (606). Simultaneously with receiving the measured current, the voltage module of the IED 100 receives a voltage measured across its power terminals 110a,b during the same startup period (606). The measured voltage and current can be stored in the database 126.

The algorithm 600 determines a voltage variation between the measured voltage and a rated voltage, which can be retrieved from the motor nameplate data 134 (608). The difference between the measured and rated voltages produces a voltage variation, and the power flows to the motor or the impedance of the motor can be normalized to the voltage and compared against a baseline to account for the voltage variation at the motor's terminals 110a,b.

The characteristic function module 122 calculates a characteristic function that includes the measured voltage and the measured starting or run current, whichever is applicable (610). In this example, the characteristic function is an impedance function calculated by dividing the measured voltage by the measured current using Ohm's Law. The calculated impedance can be stored in the database 126 along with a corresponding timestamp indicating a time that the current and voltage were measured.

The algorithm 600 can do either or both of a statistical analysis or a theoretical comparison using the measured impedance. The algorithm 600 can compare, using a statistical analysis carried out by the statistical module 128, the calculated impedance with historical impedances using the voltage variation to determine whether a criterion is satisfied (612). The historical impedances at different voltage variations can produce a baseline (used by the baseline module 124) for an excepted range of impedances at various voltage variations. When the measured impedance at the voltage variation varies from a statistical comparison of historical impedances at the same voltage variation, the algorithm 600 can determine that the criterion is satisfied. The criterion can include whether a statistically significant outcome exists as a result of the statistical comparison carried out by the statistical module 128 or whether the statistical comparison produces a probability or likelihood that the measured impedance varies significantly from the baseline impedance. Instead of or in addition to doing a statistical comparison of the measured impedance versus historical impedance values at the same voltage variation, the algorithm 600 can do a "brute force" comparison of the calculated impedance at the voltage variation with a theoretical or rated impedance at the same voltage variation under rated LRA or FLA conditions, whichever was selected in response to block 602 above (614). Here, the baseline is represented by a theoretical impedance using the rated LRA or FLA current and the rated voltage of the motor 102 at the voltage variation. The baseline impedance represents an expected impedance at a voltage corresponding to the rated voltage and the voltage variation. For example, if the rated voltage is 460V, but the measured voltage is 465V, the voltage variation is +5V, and the theoretical or expected impedance of the motor 102 is calculated at 465V. If the measured impedance using the measured current and voltage deviates from the expected impedance, the algorithm 600 determines that a criterion is satisfied, indicating that an anomaly may exist relative to the induction motor 102. The criterion can be satisfied when the measured impedance deviates from the theoretical impedance at the voltage variation by more than a fixed threshold, a relative threshold (such as expressed as a percentage), or based on a statistical threshold such as a standard deviation.

If the criterion is satisfied, the alarm module 130 can provide an alarm (616) and a report indicating a trend, an alarm, or a significant change to an electrical parameter (618). For example, the report can indicate how the motor's impedance is trending over time on a plot, for example, to provide a visual indication of the motor's impedance during starting and/or run current periods. Deviations from the motor's impedance from nominal or baseline will be normalized to the voltage so that any voltage variation will be accounted for in the trend report. The report can indicate an alarm and the nature of the alarm. For example, if the impedance is higher than expected, the report can indicate potential damage to the motor's rotor or rotor bars or a potential poor connection relative to the motor's terminals 110a,b or a potential intermittent or poor connection with one or more of the stator windings of the motor. If the impedance is lower than expected, the report can indicate a potential short-circuit in a winding or windings of a coil around a pole of the motor 102 or between adjacent coils of the motor or a potential insulation breakdown that might be caused by vibration or thermal/electrical stress in the windings. The report can indicate a significant change to an electrical parameter, such as the impedance of or power flow to the motor 102. If the impedance or power flow dips or spikes suddenly, well beyond nominal or baseline expectations, the report can indicate that immediate attention may be warranted. The output of blocks 616 and 618 can be stored in the database 126. The report can be communicated via the interface 132 to another system, such as a computer that includes a display device for displaying the report.

The algorithm 600 checks whether the motor is running at a nominal load current (620), and if so, returns to block 606. At block 606, the motor has completed its startup period and is operating at its nominal running current, which means that the motor is rotating a load 108 at or near the expected design speed of the motor 102. The length of time that the motor 102 takes to achieve nominal operation varies by the motor and can be programmed into the algorithm 600. For example, the power flow to the motor 102 can be monitored and when it reaches a relatively stable value (see FIG. 3, for example, starting at about 4 seconds after motor initial startup), the algorithm 600 can determine that the motor 102 is operating under nominal or steady-state conditions. Alternately, a fixed time, such as 5 or 10 seconds or some other wait period after the motor is turned on can be determined to be the normal running period. The characteristic function module 122 calculates a power flow (real power, reactive power, or apparent power) from the measured voltage and the inrush or nominal (steady-state) current drawn by the motor under starting or running conditions (622). The algorithm 600 determines the voltage variation between the measured voltage under inrush or nominal conditions and the rated voltage from the motor nameplate data 134 (624). The statistical module 128 evaluates or compares the measured (calculated from the measured voltage and current) power flow (real, reactive, or apparent) at the voltage variation (see FIGS. 3-4 for example) against historical power flow data for starting or running periods stored in the database 126 at or near the same voltage variation (626). Thus, if the motor is just starting and the current to the motor corresponds to a locked-rotor current, the characteristic function module 122 calculates the power flow at the voltage variation (e.g., 465V or +5V from the nominal or rated voltage of 460V) at startup of the motor 102, such as shown in FIG. 3. This calculated value is compared by the statistical module 128 against historical power flow data at the same voltage variation using statistical analysis to determine whether the calculated value deviates in a statistically significant way from the baseline or expected or theoretical power flow.

Alternately or additionally, the algorithm 600 can evaluate or compare the power flow value calculated from the measured starting or run (steady-state) current and the associated motor voltage with a theoretical or expected or baseline power flow value at the same voltage variation using the rated LRA or FLA current and the rated voltage from the motor nameplate data 134 and the voltage variation (see FIG. 3) (628). The algorithm 600 proceeds to block 616 and optionally to block 618 as described above.

The baseline can correspond to a theoretical function that includes a rated LRA or FLA current and the rated voltage. The database 126 can store these theoretical functions (e.g., corresponding to impedance or power flow) along with the corresponding voltage variation for the starting period and separately for the FLA period of motor operation.

The algorithm 600 can be applied to other electrical apparatuses besides induction motors such as transformers and lighting.

Because polyphase induction motors are critical components in most industrial processes, their reliability is essential to a business's bottom line. There are many potential hazards both internal and external to the motor that can reduce its operating life or cause the motor to unexpectedly fail. Continuously evaluating a motor's electrical characteristics is a valuable tool to identify potential motor issues in an effort to reduce unscheduled maintenance (or increase planned maintenance).

FIG. 6, described by way of example above, represents one or more algorithms that correspond to at least some instructions executed by the one or more controllers 120 to perform the above described functions or steps. Any of the methods or algorithms or functions described herein can include machine or computer-readable instructions for execution by: (a) a processor, (b) a controller 120, and/or (c) any other suitable processing device. Any algorithm, software, or method disclosed herein can be embodied as a computer program product having one or more non-transitory tangible medium or media, such as, for example, a flash memory, a CD-ROM, a floppy disk, a hard drive, a digital versatile disk (DVD), or other memory devices, but persons of ordinary skill in the art will readily appreciate that the entire algorithm and/or parts thereof could alternatively be executed by a device other than a controller and/or embodied in firmware or dedicated hardware in a well known manner (e.g., it may be implemented by an application specific integrated circuit (ASIC), a programmable logic device (PLD), a field programmable logic device (FPLD), discrete logic, etc.).

While particular aspects and implementations of the present disclosure have been illustrated and described, it is to be understood that the present disclosure is not limited to the precise construction and compositions disclosed herein and that various modifications, changes, and variations are not only contemplated but also apparent from the foregoing descriptions without departing from the scope of the present disclosure as defined in the appended claims.

What is claimed is:

1. A method of automatically determining an anomalous condition of an induction motor, comprising:

detecting, by an intelligent electronic device (IED) coupled to the induction motor, a measured inrush or starting current flowing into the induction motor during a startup period of the induction motor in which the induction motor is initially energized by an electrical circuit;

measuring, by the IED, a voltage across power terminals of the induction motor during the startup period;

determining, using a first controller of the IED, a voltage variation by determining a difference between the voltage measured across the power terminals and a rated voltage of the induction motor;

calculating, using the first controller or at least one second controller of the IED, a characteristic function corresponding to an impedance of the induction motor or a power flow to the induction motor, the characteristic function calculated using the voltage measured across the power terminals and the inrush or starting current;

comparing, using a statistical analysis performed by the first controller or the at least one second controller, the characteristic function with a baseline using the voltage variation to determine whether a criterion is satisfied, the criterion including whether a statistically significant outcome exists as a result of the comparison or whether the comparison produces a probability or likelihood that the impedance of the induction motor varies from the baseline by more than a threshold; and responsive to the criterion being satisfied:
providing, using the first controller or the at least one second controller, an indication of an anomalous operation of the induction motor in response to the anomalous condition;
detecting, using the first controller or the at least one second controller, a cause of the anomalous operation of the induction motor based on the comparison between the characteristic function and the baseline using the voltage variation; and addressing the anomalous operation of the induction motor,
wherein electrical characteristics of the induction motor are periodically evaluated to identify potential anomalous conditions in an effort to reduce unscheduled maintenance, or to increase planned maintenance.

2. The method of claim 1, wherein the baseline is a theoretical function that includes a rated inrush or locked-rotor current and the rated voltage, and the method includes determining whether the characteristic function deviates from the theoretical function at the voltage variation.

3. The method of claim 2, wherein the theoretical function is a theoretical impedance of the induction motor operating under rated conditions, the theoretical impedance being calculated using a rated inrush or locked-rotor current and the rated voltage.

4. The method of claim 2, wherein the theoretical function is a theoretical power flow to the induction motor operating under rated conditions, the theoretical power flow being calculated using a rated inrush current or locked-rotor current and the rated voltage.

5. The method of claim 1, wherein the power flow to the induction motor is real power, reactive power, or apparent power.

6. The method of claim 1, wherein the baseline is a theoretical function that includes a rated inrush or locked-rotor current and the rated voltage, and the method includes a statistical comparison of the characteristic function and historical characteristic functions including historical values of voltage measured across the power terminals and inrush or starting current supplied to the induction motor.

7. The method of claim 1, wherein the measured inrush or starting current is detected and the voltage is measured across the power terminals responsive to the measured inrush or starting current being applied to the induction motor for energizing the induction motor transitioning the induction motor from a stopped to a starting operating condition.

8. The method of claim 1, wherein the characteristic function corresponds to an impedance of the induction motor, and wherein the baseline is a theoretical impedance of the induction motor operating under rated conditions, the theoretical impedance being calculated using a rated inrush or locked-rotor current and the rated voltage.

9. The method of claim 1, wherein the threshold is a fixed threshold, a relative threshold, or a statistical threshold.

10. The method of claim 1, wherein the comparison is of the impedance corresponding to the voltage variation and a historical impedance value that includes a historical value of a voltage measured across the power terminals and an inrush or starting current supplied to the induction motor prior to the detecting the current.

11. The method of claim 1, wherein the characteristic function corresponds to a power flow to the induction motor, and wherein the baseline is a theoretical power flow to the induction motor operating under rated conditions, the theoretical power flow being calculated using a rated inrush or locked-rotor current and the rated voltage, the power flow being calculated using the measured current and the voltage measured across the power terminals.

12. The method of claim 1, wherein the comparison is of the power flow corresponding to the voltage variation and a historical power flow value corresponding to the voltage variation, the historical power flow value including a historical value of a voltage measured across the power terminals and an inrush or starting current supplied to the induction motor prior to the detecting the current.

13. The method of claim 1, wherein the indication of the anomaly includes an alarm indicating the amount by which the voltage measured across the power terminals or the measured current deviates from the rated voltage or a rated locked-rotor current of the induction motor.

14. The method of claim 1, wherein the indication of the anomaly includes whether an impedance of the induction motor at the voltage variation during the startup period is above or below an expected impedance of the induction motor corresponding to the voltage variation, the impedance being calculated using the measured current and the voltage measured across the power terminals, and the expected impedance corresponding to the voltage variation being calculated or derived based on a rated inrush or locked-rotor current of the induction motor and the rated voltage including the voltage variation.

15. The method of claim 14, wherein, responsive to the impedance exceeding the expected impedance, the anomaly indicates potential damage to a rotor or a rotor bar of the induction motor, a potential poor connection relative to one or both power terminals of the induction motor or to a stator winding of the induction motor.

16. The method of claim 14, wherein, responsive to the impedance being below the expected impedance, the anomaly indicates a potential short-circuit in a winding of a coil around a pole of the induction motor or between adjacent coils of the induction motor or a potential insulation breakdown in the induction motor.

17. The method of claim 1, further comprising:
detecting, by the IED, a measured steady-state current flowing into the induction motor during a steady-state operation of the induction motor;
measuring, by the IED, a steady-state voltage across the power terminals during the steady-state operation;
determining, using the first controller or the at least one second controller, a steady-state voltage variation by comparing the measured steady-state voltage with the rated voltage;
calculating, using the first controller or the at least one second controller, a second characteristic function that includes the measured steady-state voltage and the measured steady-state current;
comparing, using the first controller or the at least one second controller, the second characteristic function with a second baseline using the steady-state voltage variation to determine whether a steady-state criterion is satisfied; and
responsive to the steady-state criterion being satisfied, providing, using the first controller or the at least one second controller, the indication of the anomaly.

18. The method of claim 1, wherein the reactance of the induction motor is a function of frequency.

19. The method of claim 1, wherein the baseline corresponds to a predicted impedance of the induction motor, and changes in the induction motor's predicted impedance, based on actual measured values indicate fundamental deviations from the motor's design characteristics, which in turn indicate a potential problem or anomaly with the motor.

20. A non-transitory computer-readable medium encoded with instructions to cause one or more controllers of an intelligent electronic device (IED) to implement a method, the method comprising:
detecting a measured inrush or starting current flowing into an induction motor coupled to the IED during a startup period of the induction motor in which the induction motor is initially energized by an electrical circuit;

measuring a voltage across power terminals of the induction motor during the startup period using one or more sensors of the IED;
determining a voltage variation by determining a difference between the voltage measured across the power terminals and a rated voltage of the induction motor;
calculating a characteristic function corresponding to an impedance of the induction motor or a power flow to the induction motor, the characteristic function calculated using the voltage measured across the power terminals and the inrush or starting current;
comparing the characteristic function with a baseline using the voltage variation to determine whether a criterion is satisfied, the criterion including whether a statistically significant outcome exists as a result of the comparison or whether the comparison produces a probability or likelihood that the impedance of the induction motor varies from the baseline by more than a threshold
responsive to the criterion being satisfied:
providing an indication of an anomaly of the induction motor;
detecting a cause of the anomaly of the induction motor based on the comparison between the characteristic function and the baseline using the voltage variation; and
addressing the anomaly of the induction motor,
wherein electrical characteristics of the induction motor are periodically evaluated to identify potential anomalies in an effort to reduce unscheduled maintenance, or to increase planned maintenance.

21. A method of automatically determining an anomalous condition of an induction motor, comprising:
detecting, by an intelligent electronic device (IED) coupled to the induction motor, an inrush or starting current flowing into the induction motor at an initial startup period of the induction motor in which the induction motor is initially energized by an electrical circuit;
measuring, by the intelligent electronic device, a voltage across power terminals of the induction motor at the initial startup period of the induction motor;
determining, by the IED, a difference between the measured voltage and a rated voltage of the induction motor to produce a voltage variation;
calculating, using a first controller of the IED, a first characteristic function corresponding to an impedance of the induction motor or a power flow to the induction motor, the first characteristic function calculated using the voltage measured across the power terminals and the inrush or starting current;
comparing, using the first controller or at least one second controller of the IED, the characteristic function with a baseline using the voltage variation to determine whether a first criterion is satisfied, the first criterion including whether a statistically significant outcome exists as a result of the comparison or whether the comparison produces a probability or likelihood that the impedance of the induction motor varies from the baseline by more than a threshold;
detecting, by the IED, a steady-state current flowing into during a steady-state operation of the induction motor;
measuring, by the IED, a second voltage measured across the power terminals of the induction motor during the steady-state operation of the induction motor;
determining, using the first controller or the at least one second controller, a difference between the second measured voltage and the rated voltage to produce a second voltage variation;
calculating, using the first controller or the at least one second controller, a second characteristic function corresponding to an impedance of the induction motor or a power flow to the induction motor, the second characteristic function calculated using the second measured voltage and the steady-state current;
comparing, using the first controller or the at least one second controller, the second characteristic function with a second baseline using the second voltage variation to determine whether a second criterion is satisfied, the second criterion including whether a statistically significant outcome exists as a result of the comparison or whether the comparison produces a probability or likelihood that the impedance of the induction motor varies from the baseline by more than a threshold; and
responsive to the first criterion or the second criterion being satisfied:
providing, using the first controller or the at least one second controller, an indication of the anomalous condition of the induction motor;
detecting, using the first controller or the at least one second controller, a cause of the anomalous condition of the induction motor based on at least one of the first comparison and the second comparison; and
addressing the anomalous condition of the induction motor,
wherein electrical characteristics of the induction motor are periodically evaluated to identify potential anomalous conditions in an effort to reduce unscheduled maintenance, or to increase planned maintenance.

22. A method of automatically determining an anomalous condition of an induction motor, comprising:
detecting, by an intelligent electronic device (IED) coupled to the induction motor, a measured inrush or starting current flowing into the induction motor during a startup period of the induction motor in which the induction motor is initially energized by an electrical circuit;
measuring, by the IED, a voltage across power terminals of the induction motor during the startup period of the induction motor;
determining, using a first controller of the IED, a voltage variation by determining a difference between the voltage measured across the power terminals and a rated voltage of the induction motor;
calculating, using the first controller or at least one second controller of the IED, an impedance of the induction motor by dividing the voltage measured across the power terminals by the inrush or starting current;
comparing, using the first controller or the at least one second controller, the calculated impedance of the induction motor with a baseline using the voltage variation to determine whether a criterion is satisfied, the criterion including whether a statistically significant outcome exists as a result of the comparison or whether the comparison produces a probability or likelihood that the calculated impedance of the induction motor varies from the baseline by more than a threshold; and
responsive to the criterion being satisfied:
providing, using the first controller or the at least one second controller, an indication of an anomalous operation of the induction motor in response to the anomalous condition;

detecting, using the first controller or the at least one second controller, a cause of the anomalous operation of the induction motor based on the statistical comparison between the characteristic function and the baseline using the voltage variation; and
addressing the anomalous operation of the induction motor,
wherein electrical characteristics of the induction motor are periodically evaluated to identify potential anomalous conditions in an effort to reduce unscheduled maintenance, or to increase planned maintenance.

* * * * *